(12) United States Patent
Kashimoto et al.

(10) Patent No.: US 7,589,412 B2
(45) Date of Patent: Sep. 15, 2009

(54) SEMICONDUCTOR DEVICE

(75) Inventors: Hironori Kashimoto, Tokyo (JP);
Tatsuo Ota, Tokyo (JP); Shingo Sudo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 335 days.

(21) Appl. No.: 11/535,684

(22) Filed: Sep. 27, 2006

(65) Prior Publication Data

US 2007/0215999 A1    Sep. 20, 2007

(30) Foreign Application Priority Data

Mar. 3, 2006    (JP)    ............... 2006-057207

(51) Int. Cl.
*H01L 23/48*    (2006.01)
(52) U.S. Cl. ............... 257/693; 438/107; 257/E23.043
(58) Field of Classification Search ............... 257/678, 257/690–694, 697; 439/709
See application file for complete search history.

(56) References Cited

U.S. PATENT DOCUMENTS

| | | | |
|---|---|---|---|
| 4,538,168 A * | 8/1985 | Van Dyk Soerewyn | ..... 257/693 |
| 5,705,848 A | 1/1998 | Bayerer | |
| 6,365,965 B1 * | 4/2002 | Jeun | ............... 257/723 |
| 6,597,063 B1 * | 7/2003 | Shimizu et al. | ............... 257/687 |
| 6,700,194 B2 | 3/2004 | Nakajima et al. | |
| 6,979,843 B2 | 12/2005 | Nakajima et al. | |
| 2006/0238983 A1 | 10/2006 | Knapp et al. | |

FOREIGN PATENT DOCUMENTS

| | | |
|---|---|---|
| DE | 44 07 810 A1 | 9/1995 |
| DE | 196 12 514 A1 | 5/1997 |
| EP | 0 305 993 A2 | 3/1989 |
| EP | 1 424 728 A1 | 6/2004 |
| JP | 9-283681 | 10/1997 |
| JP | 9-321216 | 12/1997 |
| JP | 2003-249623 | 9/2003 |
| JP | 2004-172211 | 6/2004 |

OTHER PUBLICATIONS

U.S. Appl. No. 11/462,224, filed Aug. 3, 2006, Sudo et al.

* cited by examiner

*Primary Examiner*—Matthew Smith
*Assistant Examiner*—Daniel Shook
(74) *Attorney, Agent, or Firm*—Oblon, Spivak, McClelland, Maier & Neustadt, L.L.P.

(57) ABSTRACT

One of the aspects of the present invention is to provide a semiconductor device, which includes a base plate, an insulating substrate on the base plate, and a wiring patterned layer on the insulating substrate. Also, it includes at least one semiconductor chip bonded on the wiring patterned layer, the semiconductor chip having a surface electrode. A main terminal is connected via a conductive adhesive layer onto at least either one of the surface electrode and the wiring patterned layer. Also, a resin package covers the insulating substrate, the wiring patterned layer, the semiconductor chip, the conductive adhesive layer, and at least a portion of the main terminal.

6 Claims, 10 Drawing Sheets

SEMICONDUCTOR DEVICE

BACKGROUND OF THE INVENTION

1) Technical Field of the Invention

The present invention relates to a semiconductor device, and in particular, to the semiconductor device that can reduce its wire inductance within a resin package.

2) Description of Related Arts

In the power semiconductor device such as a power module manufactured by a conventional technique, power chips such as an Insulated Gate Bipolar Transistor (IGBT) chip and a Free Wheel Diode (FWD) chip are mounted via a conductive adhesive layer such as a solder layer onto an insulating substrate having a wire patterned layer, which are housed in a hollow resin casing.

The power chips each include surface electrodes (e.g., an emitter electrode of the IGBT chip and an anode electrode of the FWD chip), which are electrically connected via a conductive wire and the wire patterned layer with one of main terminals. Also, the power chips each include reverse electrodes (i.e., a collector electrode of the IGBT chip and a cathode electrode of the FWD chip), which are electrically connected via a conductive wire and the wire patterned layer with the other one of main terminals. Further, a control electrode such as a gate electrode of the IGBT chip is electrically connected via a conductive wire with a control terminal. Those main terminals and the control terminal are designed to extend outside beyond the casing for electrical connection with an external circuitry. As above, the IGBT chip and the FWD chip are reversely connected in parallel to construct an inverter circuitry.

The main terminals and the control terminal are supported by the resin casing and electrically connected with the wire patterned layers. Also, the conductive wires and the wire patterned layers between the main/control terminals and the chip electrodes (surface/reverse/control electrodes) are likely to be rather redundant in accordance with configuration and structure of the hollow resin casing and the wire patterned layer as well as with arrangement of the power chips. Thus, according to the conventional power module, the wire inductance of the conductive wire and the wire patterned layer tend to be more substantial as the structure thereof is more complicated.

The greater inductance of the conductive wire and the wire patterned layer causes greater surge voltage to be applied on the power chip such as the IGBT chip. This increases energy loss during switching operation of the IGBT chip, and once the surge voltage exceeding the withstanding voltage of the IGBT chip is applied, the IGBT chip may be severely damaged by the surge voltage.

Further, as the conductive wire for electrical connection between the control terminal and the control electrode of the IGBT chip is lengthier, the IGBT is more susceptible to electromagnetic noise emitted from the outside, which may cause improper or erroneous switching operation of the IGBT chip.

Moreover, the power module often includes a plurality of inverter circuitries connected in parallel, each of which has the IGBT chip reversely connected with the FWD chip in parallel, and each of the conductive wires may have wiring length different from others. This may cause deviation (variation) of ON-switch timing of the inverter circuitries, thereby to cause unbalance in operation current running through each of the IGBT chips connected in parallel. Excessive current running through one of the IGBT chips may cause fatal damage on that chip.

Therefore, it is desired that the wiring length of each of the conductive wires and wire patterned layers for one inverter circuitry is minimized and equalized to those for the other inverter circuitries.

A Japanese Patent Application JPA 9-321216 (referred to as "Reference 1" herein) discloses a power semiconductor device capable of reducing the inductance thereof, which includes nuts soldered on a base conductive layer and a lead terminal layer within a resin casing, as illustrated in FIG. 2 of Reference 1. Those nuts perform a function serving as external lead terminals.

Also, another Japanese Patent Application JPA 9-283681 (referred to as "Reference 2" herein) discloses a semiconductor device having a resin package formed by a transfer-mold injection of thermosetting resin, on which top surface external lead terminals are provided. The semiconductor device shown in FIG. 2 of Reference 2 includes an external terminal plate having the bottom end connected with the internal wiring plate and the top end soldered with a nut that is connected with an external circuitry. The nut is assembled to have an exposed surface flush with the top surface of the resin package 8.

According to Reference 1, although the nuts are supported by a hollow resin casing and a solder layer on the lead terminal layer, the hollow resin casing is filled up with soft gel resin so that the nuts are secured with insufficient mechanical strength. Therefore, there is a drawback that the torque on the nut, which is generated while fastening the nut shaft into the nut, readily breaks the connection between the nut and the lead terminal layer.

Also, the semiconductor device of Reference 2 has another problem that when the resin package is formed by transfer-mold injection of the thermosetting resin, the substantial time is required for hardening the thermosetting resin. This causes the fluidic thermosetting resin to get in a small gap between the nut and the mold, so that a resin burr is formed on the top surface of the nut, which may block good electrical connection between the nut and the external circuitry, thereby reducing the production efficiency of the semiconductor device.

Further, the external terminal plate electrically connected with the internal wiring plate has considerable inductance which limits reduction of the total inductance of the semiconductor device.

The present invention is to address the above-described drawbacks and to provide a reliable semiconductor device, which can reduce the wiring inductance between the main terminal and the semiconductor chip, and improve the mechanical strength of the main terminal.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

According to one of the aspects of the present invention, a semiconductor device, which includes a base plate, an insulating substrate on the base plate, and a wiring patterned layer on the insulating substrate. Also, it includes at least one semiconductor chip bonded on the wiring patterned layer, the semiconductor chip having a surface electrode. A main terminal is connected via a conductive adhesive layer onto at least either one of the surface electrode and the wiring patterned layer. Also, a resin package covers the insulating substrate, the wiring patterned layer, the semiconductor chip, the conductive adhesive layer, and at least a portion of the main terminal.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Referring to the attached drawings, the details of embodiment according to the present invention will be described herein. In those descriptions, although the terminology indicating the directions (for example, "upper" and "lower") is conveniently used just for clarity, it should not be interpreted that those terminology limit the scope of the present invention.

Embodiment 1

Figure 1:
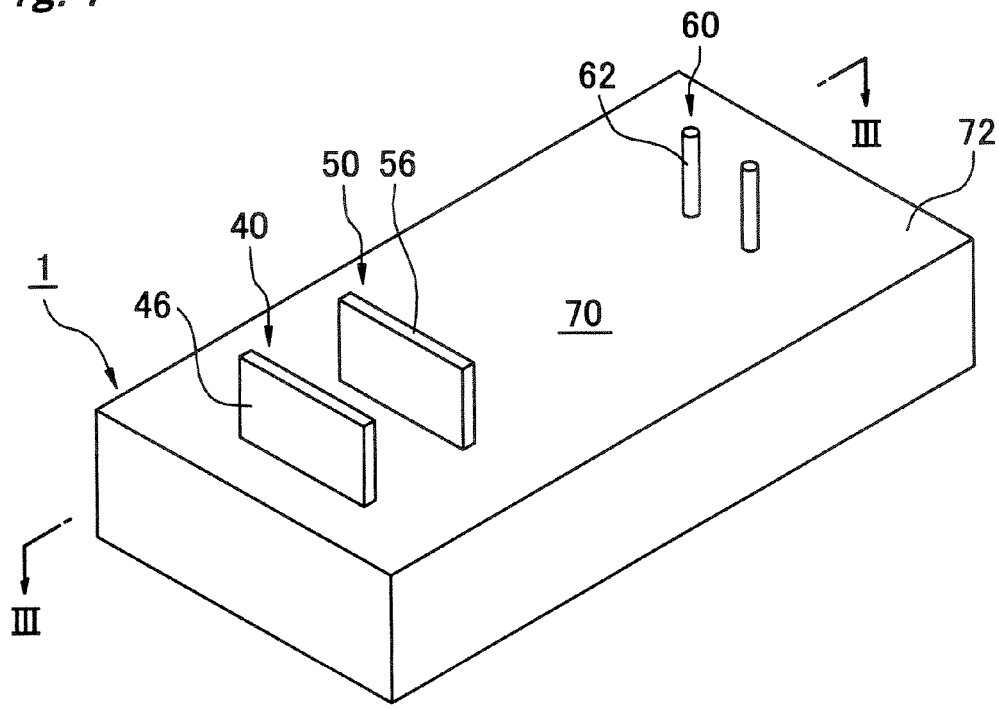
FIG. 1 is a perspective view of the first embodiment of the semiconductor device according to the present invention.
Figure 2:
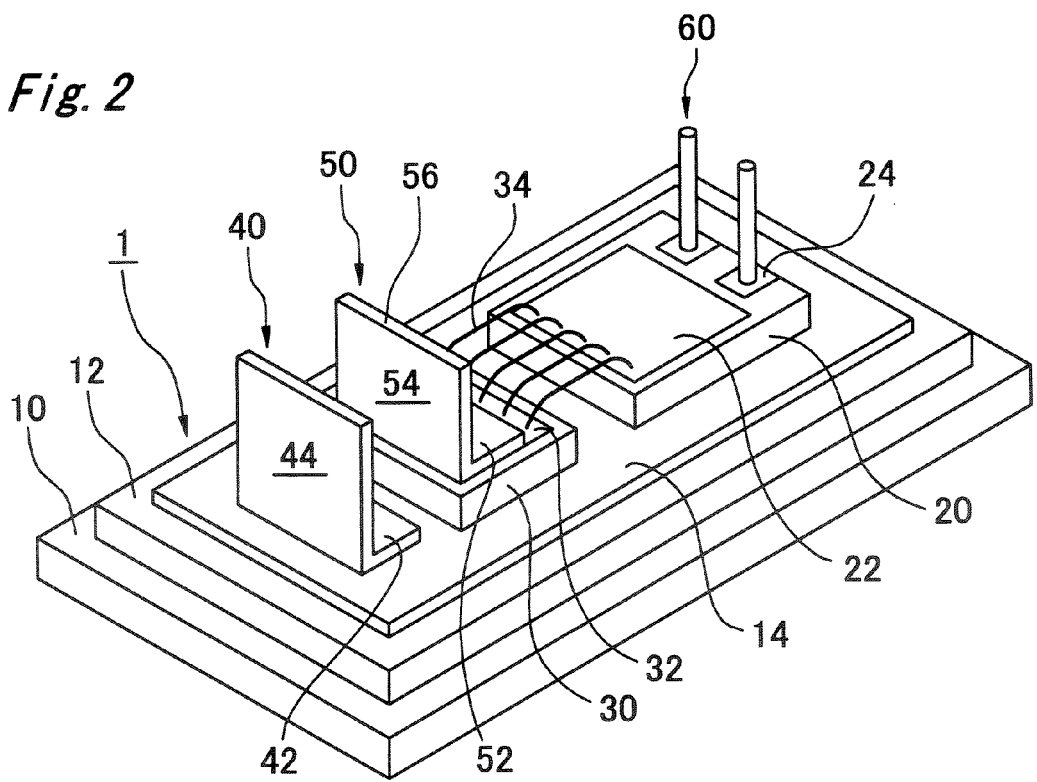
FIG. 2 is an internal perspective view of the semiconductor device of FIG. 1 with a resin package eliminated.
Figure 3:
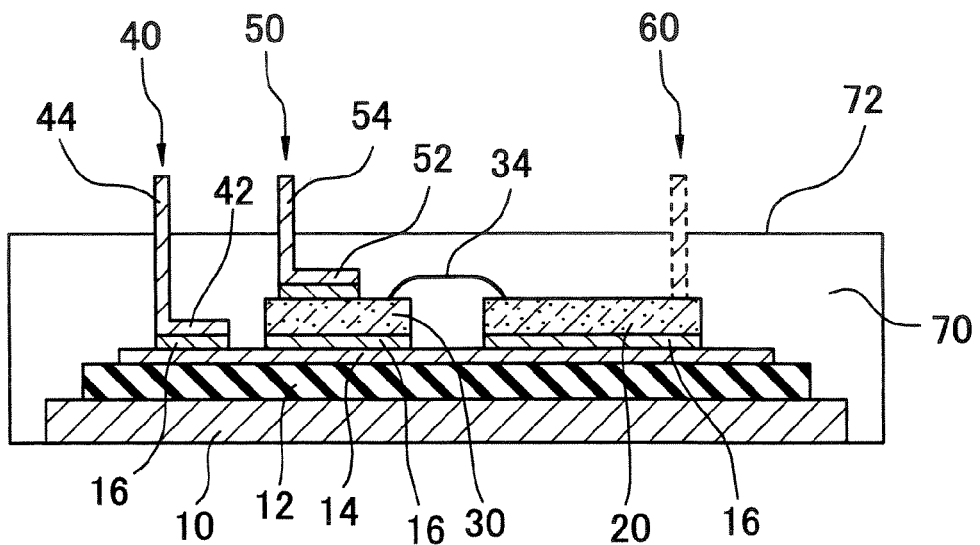
FIG. 3 is a cross sectional view taken along a III-III line of FIG. 1.

Referring to FIGS. 1 to 4, a first embodiment of the semiconductor device according to the present invention will be described herein. FIG. 1 is a perspective view of the semiconductor device according to the first embodiment, FIG. 2 is an internal perspective view of the semiconductor device of FIG. 1 with a resin package eliminated, and FIG. 3 is a cross sectional view taken along a III-III line of FIG. 1.

The semiconductor device 1 of FIG. 2 according to the first embodiment includes, in general, a base plate 10, an insulating substrate 12 secured on the base plate 10, a wiring patterned layer 14 formed on the insulating substrate 12, and at least one semiconductor chip bonded on the wiring patterned layer 14. The base plate 10 and the wiring patterned layer 14 may be made of metal such as copper. The insulating substrate 12 may be formed of insulating material such as alumina (aluminum oxide) and aluminum nitride, or of polymer material such as epoxy resin. Also, a conductive adhesive layer 16 (FIG. 3) such as a solder layer may be used for bonding the semiconductor chip onto the wiring patterned layer 14.

In the following embodiments of the present invention, an Insulated Gate Bipolar Transistor chip 20 and a Free Wheel Diode chip 30 (which are referred to simply as the "IGBT" chip and the "FWD" chip, respectively) are described hereinafter as examples of the semiconductor chips. However, the semiconductor device 1 may have another type of semiconductor chips, and also a single, three or more semiconductor chips. Thus, the present invention is not limited to the type and/or number of the semiconductor chips.

The IGBT chip 20 includes, on the bottom surface thereof, a collector electrode (not shown) that downwardly faces to the wiring patterned layer 14, and also includes, on the top surface thereof that upwardly face, an emitter electrode 22 and a control electrode 24 such as a gate electrode and a current sensing electrode. Also, the FWD chip 30 includes a cathode electrode (not shown) on the bottom surface thereof and an anode electrode 32 on the top surface thereof. While the collector electrode and the cathode electrode are connected with the wiring patterned layer 14 via a solder layer 16, the emitter electrode 22 and the anode electrode 32 are electrically connected to each other via conductive wires 34 of metal such as aluminum. Thus, the IGBT chip 20 and the FWD chip 30 are reversely connected in parallel and compose an inverter circuitry. It should be noted that in the present specification, the emitter electrode 22, control electrode 24, and the anode electrode 32 may collectively be referred to as "surface electrodes" and the collector electrode and the cathode electrode may collectively be called as "reverse electrodes".

Also, the semiconductor device 1 of the first embodiment includes L-shaped main terminals 40, 50, which are bonded on the wiring patterned layer 14 and the anode electrode 32 of the FWD chip 30, respectively, via any conductive adhesive layers 16 such as a solder layer. The L-shaped main terminals 40, 50 are formed by bending plates of conductive material such as metal, and include connection portions 42, 52 opposing to the solder layer 16 and plate-shaped extension portions 44, 54 extending in a direction substantially vertical to the solder layer 16, respectively.

Also, as illustrated in FIGS. 2 and 3, the semiconductor device 1 has control terminals (auxiliary terminals) 60 directly bonded on the control electrodes (the gate electrode and the current sensing electrode) 24 via any conductive adhesive layers (not shown).

The unfinished semiconductor device so assembled but before being molded (FIG. 2) is arranged within the molding dice, which in turn is filled up with thermoplastic resin by an injection-molding technique so that a resin package 70 is formed and the semiconductor device 1 shown in FIG. 1 is achieved. The resin package 70 is formed to completely encompass the connection portions 42, 52 of the L-shaped main terminals 40, 50, and expose the top ends 46, 56 of the extension portions 44, 54 and the top end 62 of the control terminal 60. For clarity of FIG. 3, the hatching of the resin package 70 is eliminated.

According to the semiconductor device 1 so structured, the wiring inductance from the surface electrodes 22, 32 of the semiconductor chips 20, 30 up to the main terminals 40, 50 and the control terminal 60 can substantially be reduced. Therefore, reduction of the wiring inductance of the semiconductor device 1 suppresses the serge voltage applied on the semiconductor chips 20, 30 as to reduce the energy loss generated during switching operation, thereby preventing the semiconductor chip from being damaged by the serge voltage.

As described above, the resin package 70 covers and secures a whole of the connection portions 42, 52 and most of the extension portions 44, 54, so as to maintain connection of the L-shaped main terminals 40, 50 with the wiring patterned layer 14 and the anode electrode 32, respectively, without breakage, even when the exposed top ends 46, 56 (FIG. 1) receives the mechanical stress. Also, since most of the control terminal 60 except the top ends is securely supported by the resin package 70, the robust semiconductor device 1 can be realized which is hardly broken at the connection interface between the control terminal 60 and the control electrode 24.

Figure 4A:
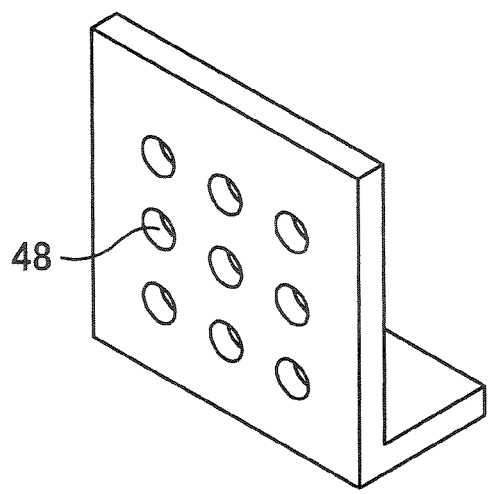
FIG. 4 is a perspective view of a modified L-shaped main terminal.
Figure 4B:
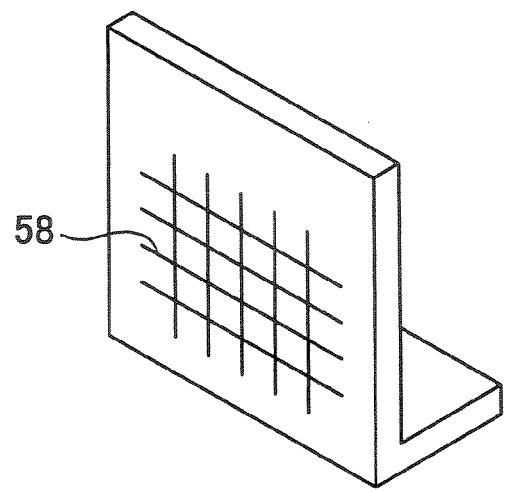

While the L-shaped main terminals 40, 50 are formed by bending a flat planner member (plate), the extension portions 44, 54 may includes through-holes 48 or roughness (grooves) 58, as illustrated in FIGS. 4A and 4B, to enhance the adhesion feature with the thermoplastic resin (the resin package 70).

Although not limited thereto, the thermoplastic resin may include, for example, polyphenylene sulfide (PPS) resin, polybutylene terephthalate (PBT) resin, liquid crystal polymer (LCP).

Embodiment 2

Figure 5:
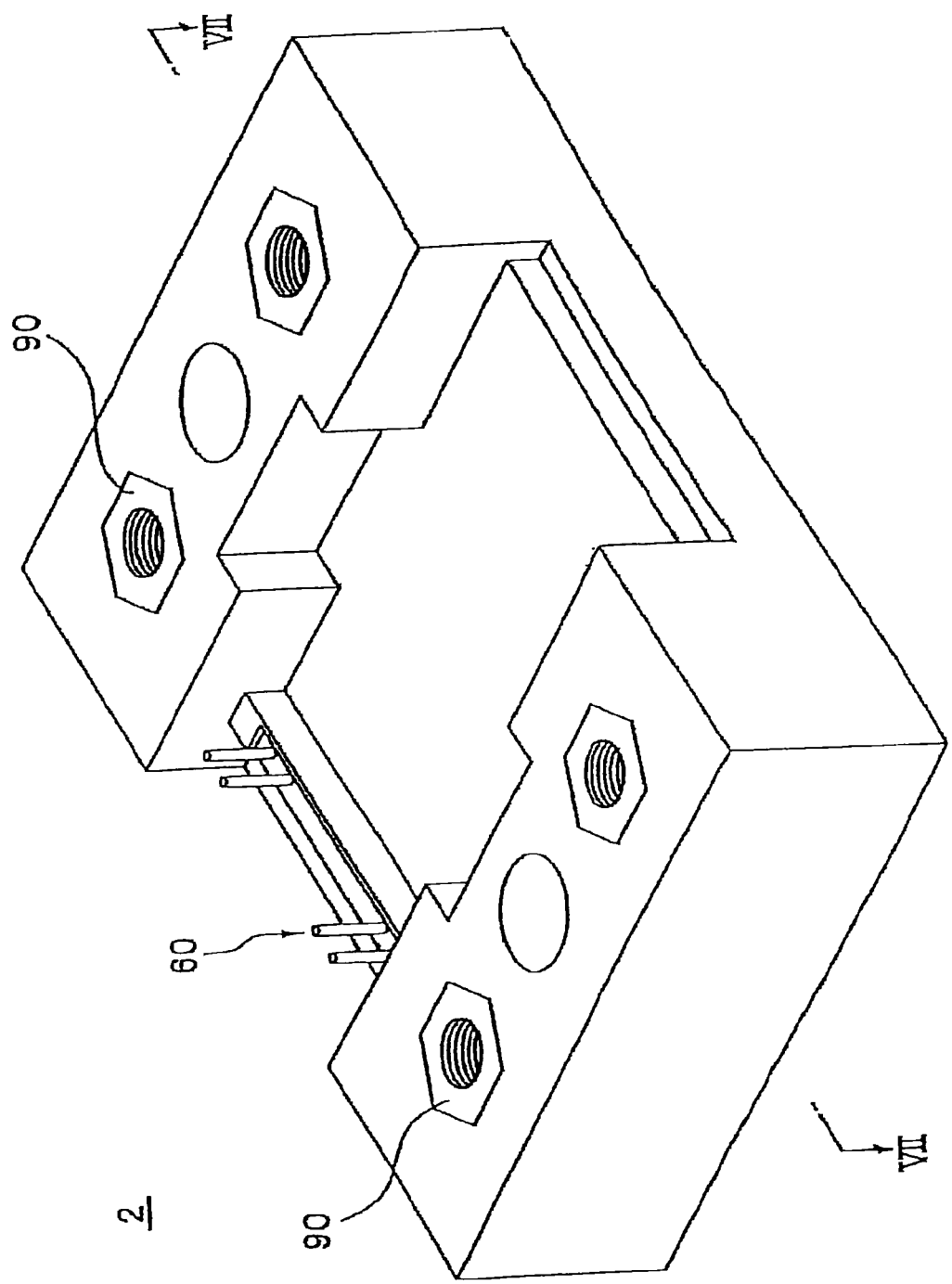
FIG. 5 is a perspective view of the second embodiment of the semiconductor device according to the present invention.
Figure 6:
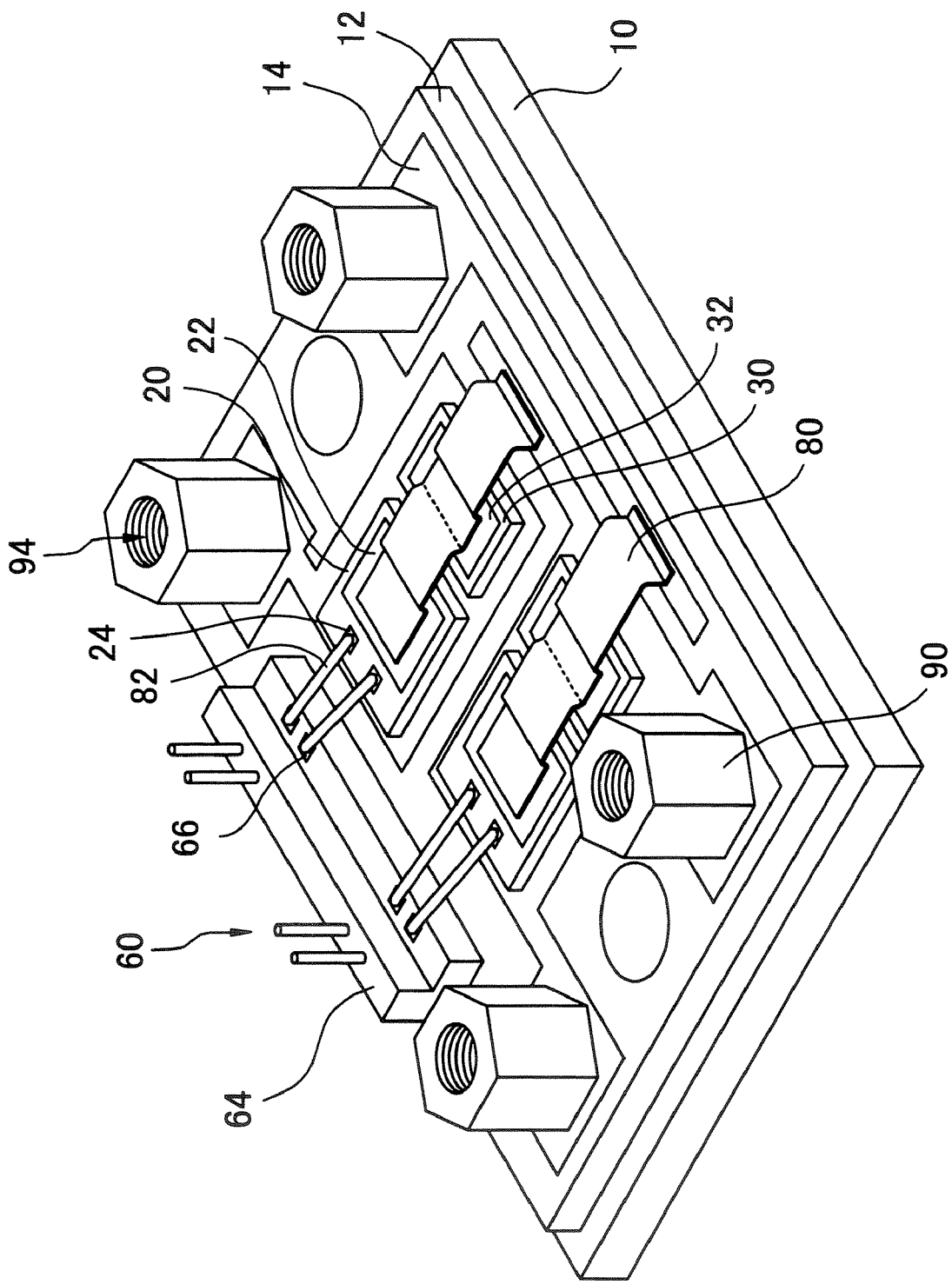
FIG. 6 is an internal perspective view of the semiconductor device of FIG. 5 with a resin package eliminated.
Figure 7:
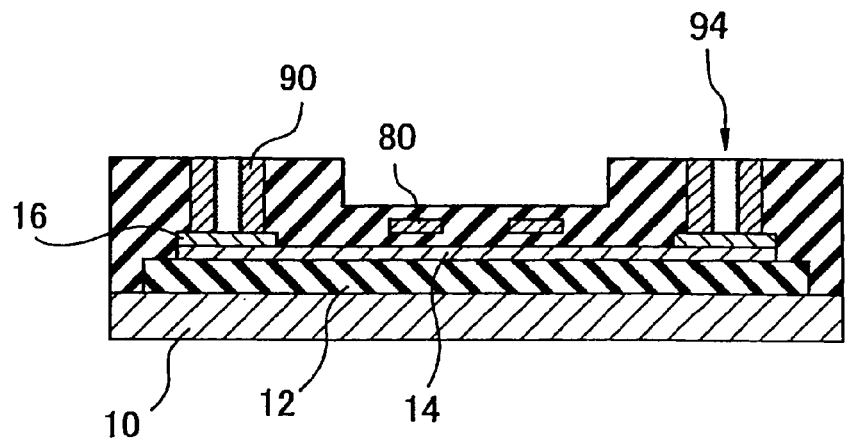
FIG. 7 is a cross sectional view taken along a VII-VII line of FIG. 5.

Referring to FIGS. 5 to 8, a second embodiment of the semiconductor device according to the present invention will be described herein. FIG. 5 is a perspective view of the semiconductor device according to the second embodiment, FIG. 6 is an internal perspective view of the semiconductor device of FIG. 5 with a resin package eliminated, and FIG. 7 is a cross sectional view taken along a VII-VII line of FIG. 5.

Since the semiconductor device 2 of the second embodiment includes components (and material thereof) similar to those of the semiconductor device 1 of the first embodiment that are denoted with similar reference numerals, no duplicate description will be made therefor, focusing on components different from those of the first embodiment.

As shown in FIG. 6, the semiconductor device 2 of the second embodiment includes the base plate 10, the insulating substrate 12 on the base plate 10, the wiring patterned layer 14 on the insulating substrate 12, and two pairs of the IGBT chips 20 and the FWD chips 30 mounted on the wiring patterned layer 14 via the solder layers 16 (FIG. 7). Similar to the first embodiment, each pair of the IGBT chips 20 and the FWD chips 30 are reversely connected in parallel to compose the inverter circuitry, thus, the semiconductor device 2 includes two inverter circuitries connected in series.

While the conductive wires 34 such as aluminum wires are used in the first embodiment for electrical connection between the emitter electrode 22 of the IGBT chip 20 and the anode electrode 32 of the FWD chip 30, in the second embodiment, the electrical connection therebetween is achieved by means of a conductive lead plate (also referred to as a "direct lead"), which is formed by appropriately bending a plate of conductive material. The conductive lead plates 80 are also connected with main terminals 90 through the respective wiring patterned layers 14.

Each of the control electrodes 24 of the IGBT chips 20 is also electrically connected via another conductive lead plate 82 with a header electrode 66 on a header 64. Because each of the header electrodes 66 is electrically connected to the respective control terminal (auxiliary terminal) 24, the control electrodes 24 of the IGBT chip 20 can be led out the control terminals 60. However, instead of the conductive lead plate 82, the conventional conductive wires may be used for connecting the control electrodes 24 with the header electrodes 66.

Further, the main terminal 90 of the second embodiment has an internally threaded hole 94 extending in a direction substantially perpendicular to the solder layer 16. Thus, the resin package 70 is formed by the injection molding technique so that the main terminal 90 is thoroughly embedded within the resin package 70 while the internally threaded hole 94 is exposed. The main terminal 90 may have any configuration as long as it includes the internally threaded hole, and preferably is a hexagonal nut as shown in FIG. 6. Also, the main terminal 90 is made of material of excellent conductivity such as copper and aluminum plated with nickel for facilitating the soldering. However, since the main terminal 90 receives substantial torque when a volt is fastened into the internally threaded hole for securing a busbar (not shown) on the main terminal 90, it preferably includes an outline that counteracts the torque, rather than a column-like outline. The outline of the main terminal 90 may have plate-like or rectangular configuration with the internally threaded hole 94.

According to the second embodiment, the wiring inductance of the main terminal 90 and the control terminal 60 extending from the surface electrodes 22, 24, 32 of the semiconductor chip 20, 30 can substantially be reduced. Therefore, the reduction of the total inductance of the semiconductor device 2 suppresses the serge voltage applied to the semiconductor chips 20, 30 so as to reduce the energy loss generated during switching operation and avoid breakage of the semiconductor chips due to the serge voltage.

Further, since the main terminal 90 except the internally threaded hole 94 is encompassed and supported by the resin package 70, the main terminals 90 can be kept connecting on the wiring patterned layer 14 without being disconnected even when they receives the mechanical stress around the internally threaded hole 94. Therefore, a robust semiconductor device 2 can be obtained.

It should be noted that while the main terminals 40, 50 of the first embodiment has the extension portions 44, 54, the semiconductor device 2 of the second embodiment has no extension portion, which further reduces the total wiring inductance and size in height (size in a vertical direction) of the semiconductor device 2.

Figure 8:
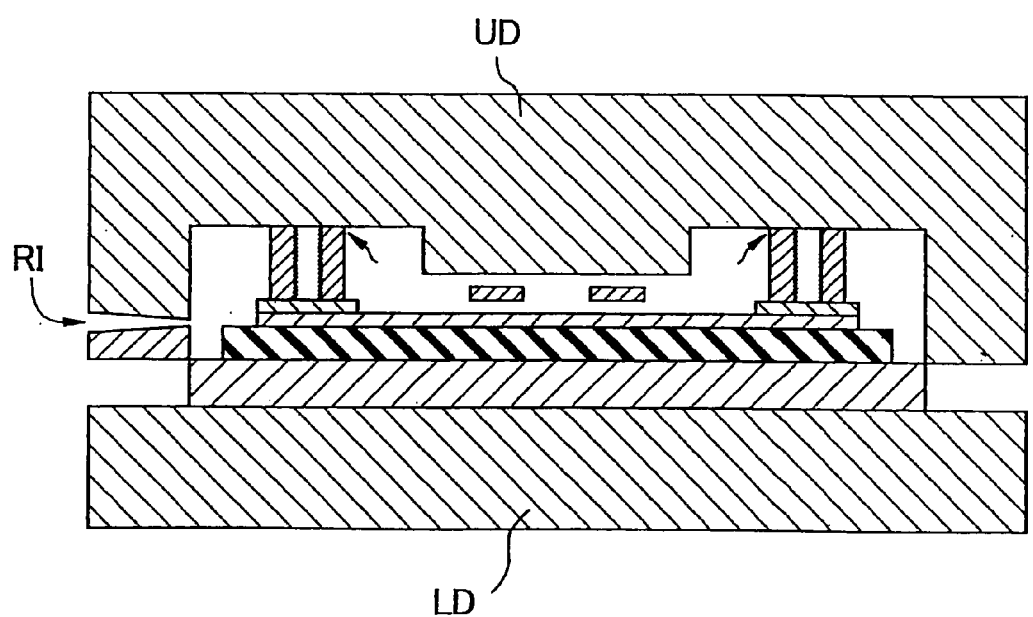
FIG. 8 is a cross sectional view of an unfinished semiconductor device provided between upper and lower dice.

As above, the semiconductor device 2 of the second embodiment is realized, as illustrated in FIG. 8, by arranging the unfinished (uncompleted) semiconductor device before being molded, within upper and lower dice UD, LD, and by injection-molding the thermoplastic resin from the resin inlet RI into the dice. As the aforementioned Reference 2, if the resin package is formed by transfer-molding the thermosetting resin, the resin intrudes into the small gap between the main terminal 90 and the upper molding die UD (as indicated by an arrow of FIG. 8) to form the resin burr. Thus, the finished semiconductor device 2 may often have a problem with the resin burr on the top end of the main terminal 90, where improper electrical connection is made between the main terminal 90 and the busbar thereby to cause the poor production efficiency of the semiconductor device 2.

Contrary to this, according to the present embodiment, the resin package 70 is formed of the thermoplastic resin, which is rapidly cooled down (for hardening) in contact with the dice, preventing the formation of the resin burr between the main terminal 90 and the upper die UD.

Embodiment 3

Figure 9:
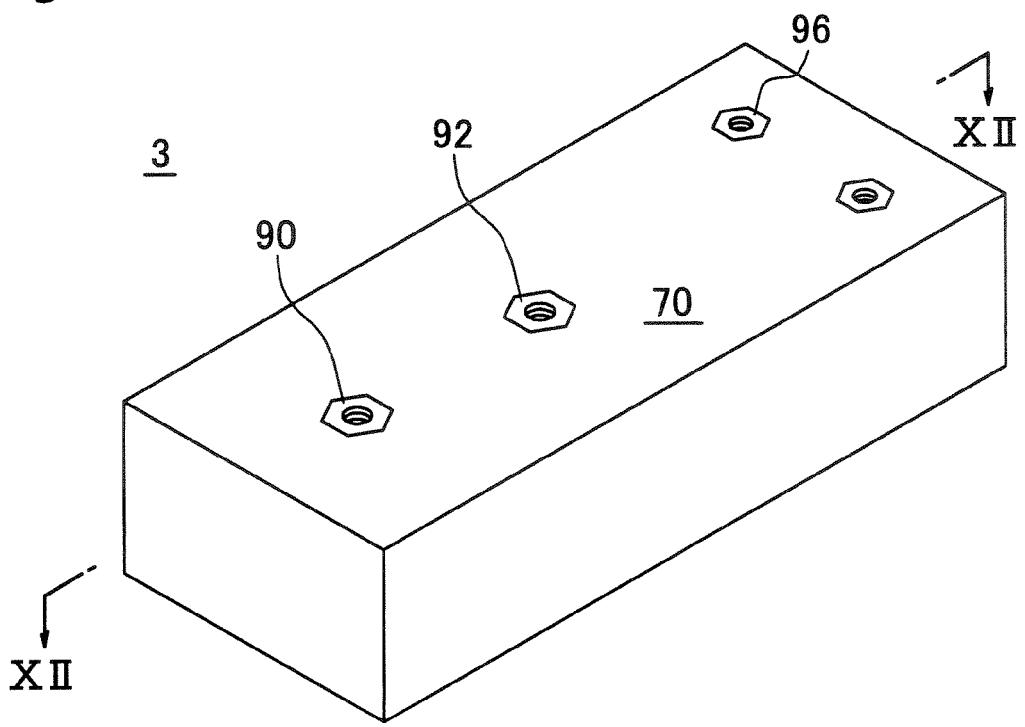
FIG. 9 is a perspective view of the third embodiment of the semiconductor device according to the present invention.
Figure 10:
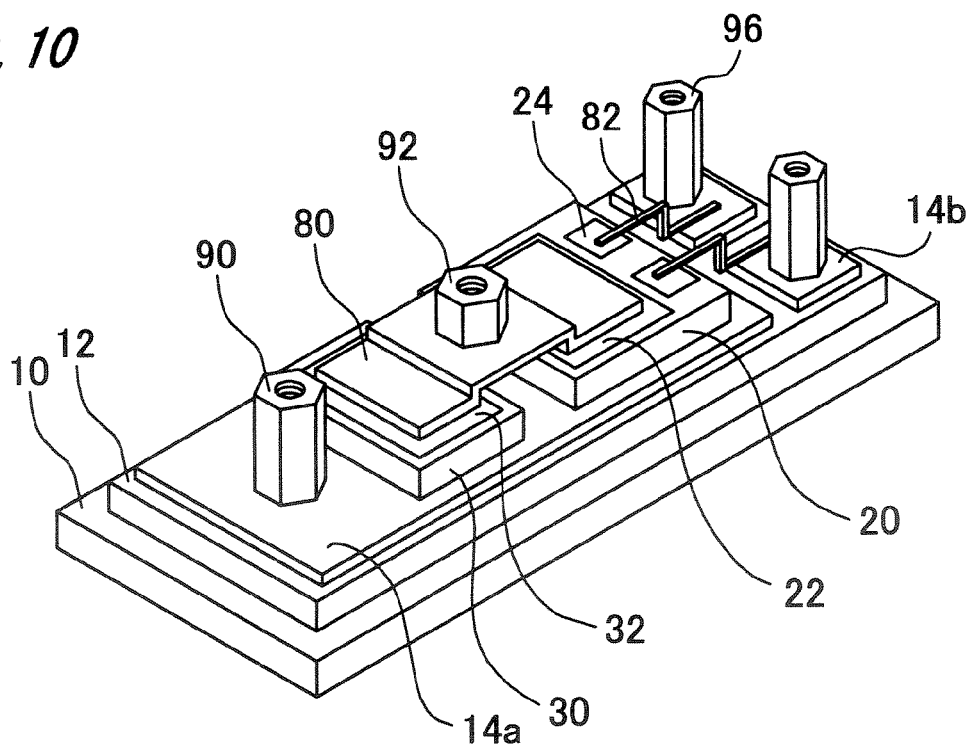
FIG. 10 is an internal perspective view of the semiconductor device of FIG. 9 with a resin package eliminated.
Figure 11:
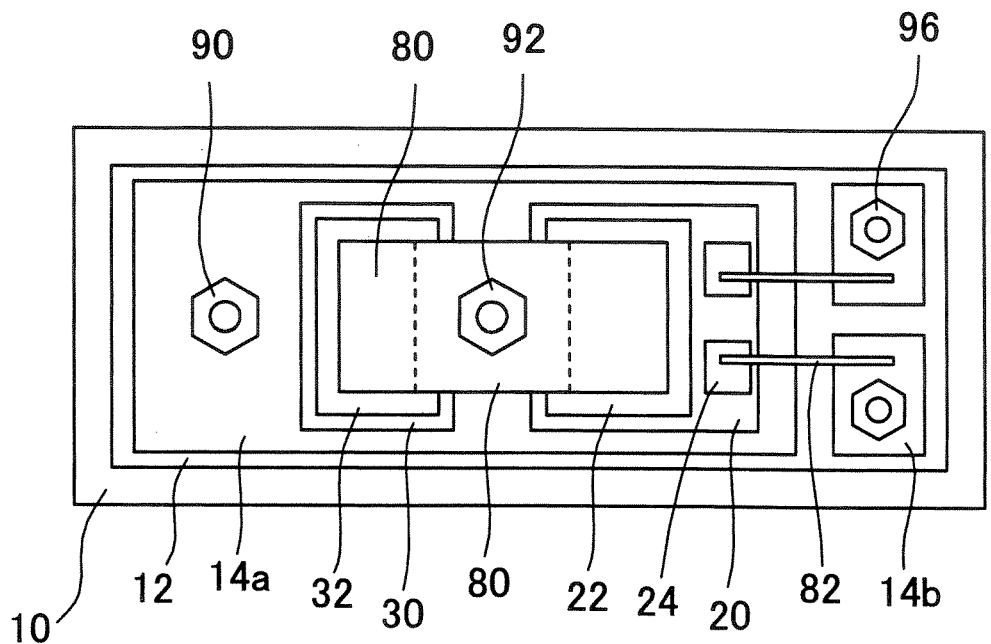
FIG. 11 is a top plan view of the semiconductor device of FIG. 9 with a resin package eliminated.
Figure 12:
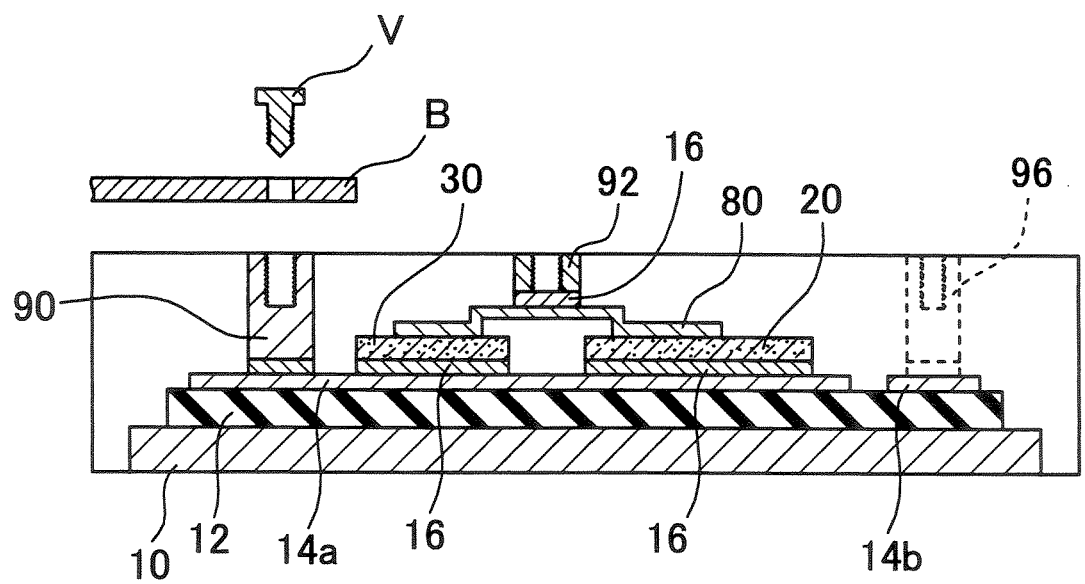
FIG. 12 is a cross sectional view taken along a XII-XII line of FIG. 9.

Referring to FIGS. 9 to 12, a third embodiment of the semiconductor device according to the present invention will be described herein. FIG. 9 is a perspective view of the semiconductor device according to the third embodiment, FIGS. 10 and 11 are internal perspective and top plan views of the semiconductor device of FIG. 9 with a resin package eliminated, respectively. FIG. 12 is a top plan view of a cross sectional view taken along a XII-XII line of FIG. 9.

Since the semiconductor device 3 of the third embodiment includes components (and material thereof) similar to those of the semiconductor device 1 of the first embodiment, which are denoted with similar reference numerals, and no duplicate description will be made therefor, focusing on components different from those of the first embodiment.

As illustrated in FIG. 10, the semiconductor device 3 of the third embodiment includes the base plate 10, the insulating substrate 12 on the base plate 10, first and second wiring patterned layers 14a, 14b which are formed on the insulating substrate 12 and spaced from each other, and the IGBT chip 20 and the FWD chip 30 mounted on the wiring patterned layer 14a via the solder layer 16 (FIG. 12).

Similar to the second embodiment, the IGBT chip 20 and the FWD chip 30 are electrically connected to each other through the conductive lead plate (direct lead) 80. The electrical connection between the conductive lead plate 80 and the surface electrodes 22, 32 are made by means of any conductive adhesive layers 16 (FIG. 12) such as the solder layer. Also, similar to the above embodiments, the IGBT chip 20 and the FWD chip 30 are reversely connected in parallel to compose the inverter circuitry.

Unlike the second embodiment, the conductive lead plate 80 of the third embodiment is not electrically connected with the wiring patterned layer 14, rather, an inter-chip terminal 92 is bonded onto the conductive lead plate 80 via the conductive adhesive layer 16 such as the solder layer.

Meanwhile, the main terminal 90 similar to that of the second embodiment is bonded onto the first wiring patterned layer 14a via the conductive adhesive layer (not shown). The second wiring patterned layer 14b is electrically connected with the control electrode 24 of the IGBT chip 20 via the direct lead and the solder layer (not shown). It should be noted that the conventional aluminum wire may be used for electrical connection between the second wiring patterned layer 14b and the control electrode 24 of the IGBT chip 20. Also, bonded onto the second wiring patterned layer 14b via the conductive layer 16 is the control terminal (auxiliary terminal) 96.

Each of the main terminal 90, the inter-chip terminal 92, and the control terminal 96 has the internally threaded hole extending in a direction substantially perpendicular to the solder layer 16, and the resin package 70 is formed by the injection molding technique so that the main terminal 90, the inter-chip terminal 92, and the control terminal 96 are substantially embedded within the resin packaged 70 with the internally threaded hole 94 exposed. The main terminal 90, the inter-chip terminal 92, and the control terminal 96 may have any configuration as long as each of them has the internally threaded hole 94. Thus, those terminals may have plate-like or rectangular configuration, and desirably be hexagonal nuts.

As illustrated in FIG. 12, the busbur B can be secured on the semiconductor device 3 by fastening the volt V into the internally threaded holes 94 of those terminals 90, 92, 94.

According to the third embodiment, the wiring inductance of the inter-chip terminal 92 and the control terminal 96 extending from the conductive lead plate 80 and the control electrode 24 can be minimized. Also, the wiring inductance of the main terminal 90 extending from the first wiring patterned layer 14a can substantially be reduced. Therefore, the reduction of the total inductance of the semiconductor device 3 suppresses the serge voltage applied to the semiconductor chips 20, 30 so as to reduce the energy loss generated during switching operation and avoid breakage of the semiconductor chip 20, 30 due to the serge voltage.

Further, since with exception of the internally threaded holes, the main terminal 90, the inter-chip terminal 92, and the control terminal 96 are encompassed and supported by the resin package 70, those terminals 90, 92, 96 can be kept connecting on the wiring patterned layer 14 without being disconnected even when they receives the mechanical stress around the internally threaded hole. Therefore, a robust semiconductor device 3 can be realized.

Also, according to the present embodiment, the resin package 70 is formed of the thermoplastic resin, thus, the semiconductor device 3 can be achieved eliminating the resin burr and the connection failure between the busbars and the terminals.

Embodiment 4

Figure 13:
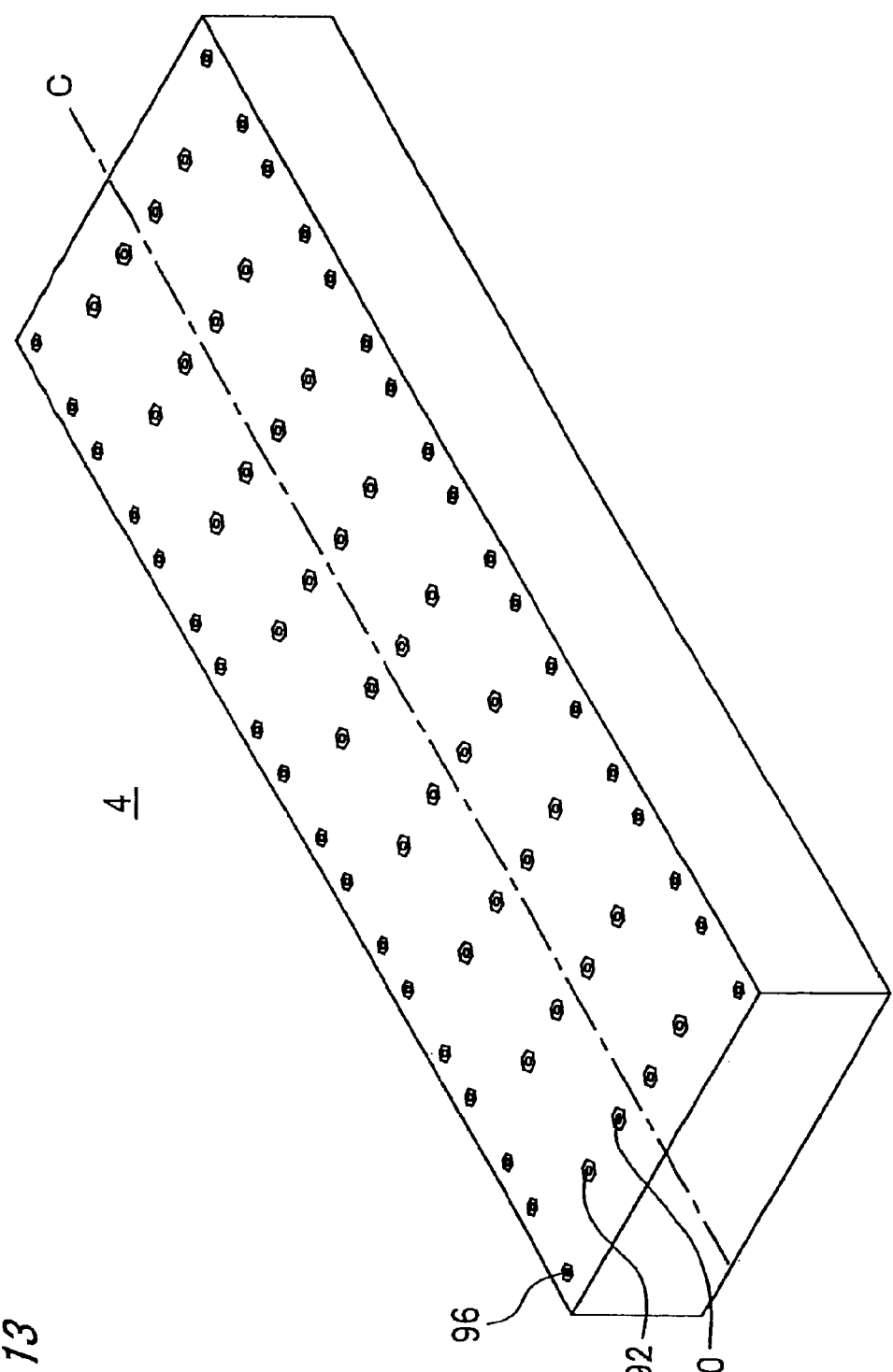
FIG. 13 is a perspective view of the fourth embodiment of the semiconductor device according to the present invention.
Figure 14:
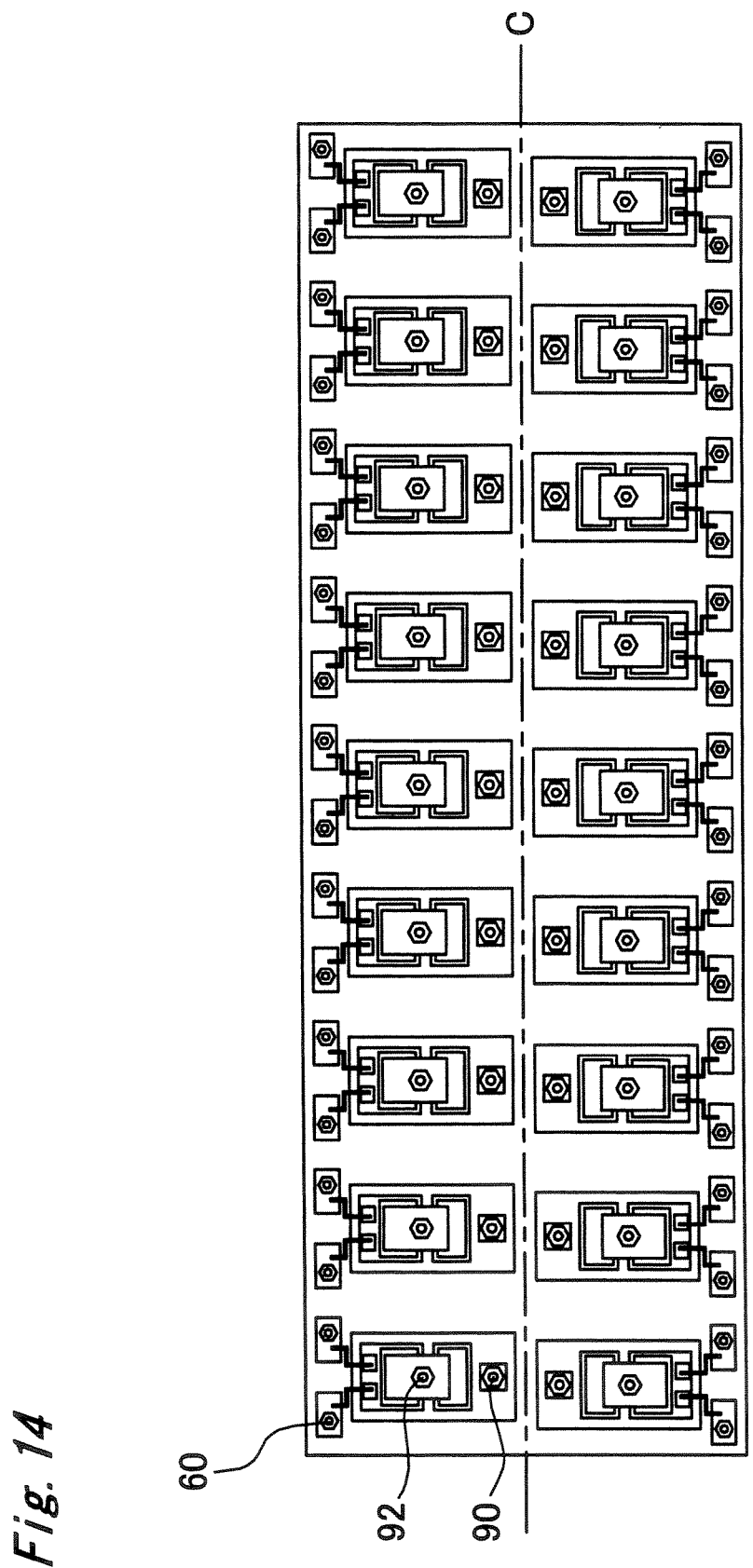
FIG. 14 is a top plan view of the semiconductor device of FIG. 13 with a resin package eliminated.
Figure 15A:
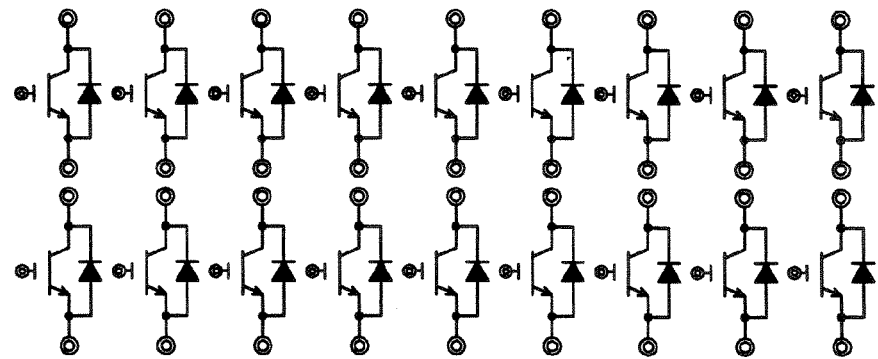
FIG. 15A is an internal circuit diagram of the semiconductor device.
Figure 15B:
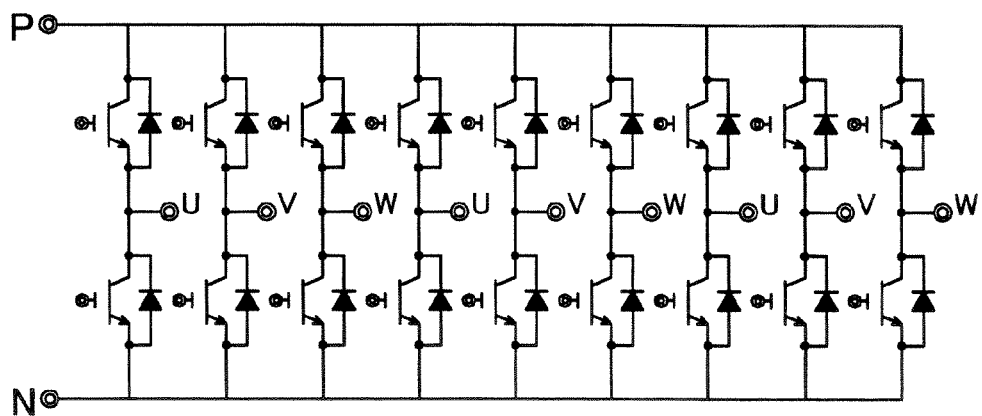
FIGS. 15B and 15C are exemplary external wiring diagrams for connection terminals.
Figure 15C:
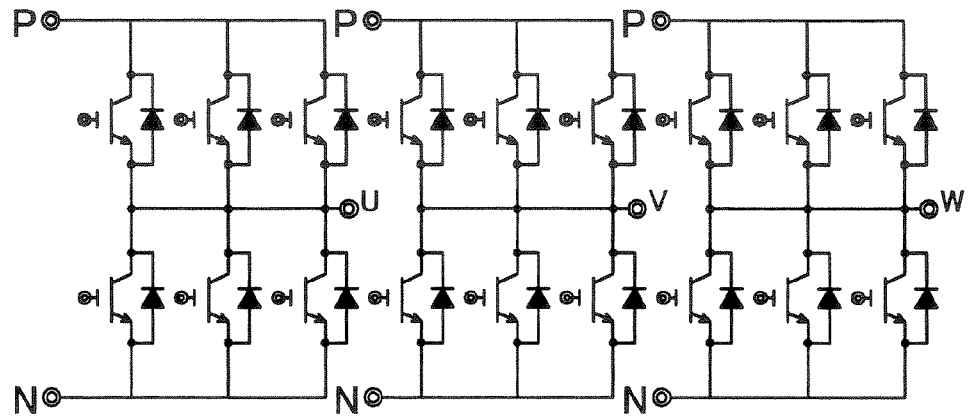

Referring to FIGS. 13 to 15, a fourth embodiment of the semiconductor device according to the present invention will be described herein. FIGS. 13 and 14 are internal perspective and top plan views of the semiconductor device of FIG. 13 with a resin package eliminated, respectively. FIG. 15A is an internal circuit diagram of the semiconductor device, and FIGS. 15B and 15C are exemplary external wiring diagrams for connection of the terminals.

The semiconductor device 4 of the fourth embodiment includes components similar to those of the third embodiment which are denoted with similar reference numerals, except that a plurality of semiconductor devices is incorporated into a single resin package 70. Therefore, the duplicate description for the similar components of the fourth embodiment will be eliminated.

In general, as the recent power semiconductor devices have a trend to control more substantial current running across higher voltage, many of them incorporate a plurality of the IGBT chips and the FWD chips molded within a single resin package. According to the typical semiconductor devices, the control electrodes of the IGBT chips are electrically connected to a single control terminal through internal wirings within the resin package. Thus, each of the internal wiring between the control electrode and the single control terminal is different from others in accordance with the arrangement of the IGBT chips within the resin package. Therefore, the simultaneous switching (switching simultaneity) of the IGBT chips may not be secured, which causes variation of controlled current running through each of the IGBT chips. In a worst scenario, the controlled current running excessively through a certain IGBT chip may bring fatal damage thereon.

In the meantime, according to the fourth embodiment of the present invention, the semiconductor device 4 includes two rows and nine lines (2×9) of inverter circuitries, each of which main terminals 90, inter-chip terminals 92, and control terminals 96 protrudes from the resin package 70 independently upon those of the other inverter circuitries. In other words, one of the wirings between the control terminals 96 and the control electrodes 24 of the IGBT chips 20 has the same length of others. Therefore, if the external wirings between a control signal source (not shown) and the control terminals 96 are designed to be the same as others, the switching simultaneity of the IGBT chips can be achieved.

Also, according to the fourth embodiment, as illustrated in FIGS. 13 and 14, one of the main terminals 90, the inter-chip terminals 92, and the control terminals 96 are symmetrically arranged to another one in relative to a center line C of FIG. 13, respectively, which facilitates an end-user to design the external wirings to be the same.

Furthermore, two rows and nine lines (2×9) of the inverter circuitries of FIG. 15A may be connected through the external wirings by connecting each row of inverter circuitries in series as illustrated in FIG. 15B, so that three sets of the semiconductor devices can be realized which independently control three phases (U-, V-, W-phase) of driving current. Also, as illustrated in FIG. 15C, a single power semiconductor device for controlling more substantial current can be achieved by means of external wirings connecting each row of inverter circuitries in series and three lines thereof in parallel. As above, according to the fourth embodiment, each of the main terminals 90, the inter-chip terminals 92, and the control terminals 96 extends from the resin package 70 independently from others, and those terminals are symmetrically arranged to the others in relative to the center line C. This enhances the flexibility for designing the external wirings at the end-user.

What is claimed is:

1. A semiconductor device, comprising:
   a base plate;
   an insulating substrate on said base plate;
   a wiring patterned layer on said insulating substrate;
   at least two semiconductor chips bonded on said wiring patterned layer, each of said semiconductor chips having surface electrode;
   a lead plate connected onto each of the surface electrodes of said semiconductor chips;
   an inter-chip terminal connected via a conductive adhesive layer onto said lead plate;
   a resin package covering said insulating substrate, said wiring patterned layer, said semiconductor chips, the conductive adhesive layer, and at least a portion of said inter-chip terminal.

2. The semiconductor device according to claim 1,
   wherein said inter-chip terminal has an internally threaded hole, which is exposed by said resin package.

3. The semiconductor device according to claim 1,
   wherein said semiconductor chips include a pair of an transistor chip and a diode chip which are reversely connected in parallel, the transistor chip having a control electrode,
   wherein a control terminal is connected on the control electrode of the transistor chip, extending in a direction perpendicular to the control electrode, and
   wherein said resin package exposes a portion of said control terminal.

4. The semiconductor device according to claim 1, further comprising a plurality of main terminals, each of which is connected onto said wiring patterned layer; and
   wherein said semiconductor chips include a plurality of pairs of transistor chips and diode chips, each pair of which are reversely connected in parallel, each of the transistor chips having a control electrode, and
   wherein a plurality of control terminals are connected with the control electrodes of the transistor chips, extending in a direction perpendicular to the control electrodes, and
   wherein said resin package exposes a portion of each of said control terminals.

5. The semiconductor device according to claim 4,
   wherein each of said main terminals, said inter-chip terminals, and said control terminals include the portions exposed by said resin package, and
   wherein one of said main terminals, said inter-chip terminals, and said control terminals is symmetrically arranged to another one in relative to a center line, respectively.

6. The semiconductor device according to claim 1,
   wherein said resin package is formed of thermoplastic resin.

* * * * *